(12) United States Patent
Yang

(10) Patent No.: US 8,810,270 B2
(45) Date of Patent: Aug. 19, 2014

(54) WAFER PROBE STATION CAPABLE OF ACTIVELY CONTROLLING TILT OF CHUCK AND CONTROLLING METHOD THEREOF

(75) Inventor: Hong-Jun Yang, Seoul (KR)

(73) Assignee: Semics Inc. (KR)

( * ) Notice: Subject to any disclaimer, the term of this patent is extended or adjusted under 35 U.S.C. 154(b) by 456 days.

(21) Appl. No.: 13/375,583

(22) PCT Filed: Jun. 1, 2010

(86) PCT No.: PCT/KR2010/003500
§ 371 (c)(1),
(2), (4) Date: Dec. 1, 2011

(87) PCT Pub. No.: WO2010/140814
PCT Pub. Date: Dec. 9, 2010

(65) Prior Publication Data
US 2012/0074977 A1  Mar. 29, 2012

(30) Foreign Application Priority Data

Jun. 3, 2009 (KR) .......................... 10-2009-0049047
Nov. 3, 2009 (KR) .......................... 10-2009-0105304

(51) Int. Cl.
*G01R 1/04* (2006.01)
*G01R 31/28* (2006.01)
*G01R 25/00* (2006.01)

(52) U.S. Cl.
CPC .......... *G01R 31/2891* (2013.01); *G01R 25/005* (2013.01)
USPC ............... 324/754.11; 324/158.1; 324/756.16

(58) Field of Classification Search
CPC .......... G01R 31/2891; G01R 31/2887; G01R 31/2851; G01R 31/2829; G01R 31/00; G01R 31/02
USPC .................... 324/158.1, 754.11, 750.16, 724, 324/750.19, 750.22, 754.03, 757.03, 866.5
See application file for complete search history.

(56) References Cited

U.S. PATENT DOCUMENTS 4,758,785 A  7/1988 Rath
4,912,399 A  3/1990 Greub et al.
(Continued)

FOREIGN PATENT DOCUMENTS

KR  10-1997-0008456  2/1997
KR  10-1999-0001118  1/1999
KR  10-1999-0006209  1/1999
(Continued)

OTHER PUBLICATIONS

International Search Report—PCT/KR2010/003500 dated Dec. 14, 2010.

*Primary Examiner* — Arleen M Vazquez
*Assistant Examiner* — Neel Shah
(74) *Attorney, Agent, or Firm* — Cantor Colburn LLP

(57) ABSTRACT

The wafer probe station includes: a plurality of the pressure sensors; a tilt correction unit which is constructed with a plurality of actuators, a plurality of displacement sensors which are disposed at positions adjacent to the corresponding actuators and a microcomputer; and a control unit which allows the wafer to be come in contact with the probe card by lifting up a Z-axis stage by a predetermined overdriving amount, extracts the pressure values of the installation positions from the pressure sensors, calculates driving amounts of the actuators of the tilt correction unit by using the pressure values so that a uniform load is applied to the chuck, calculates X and Y directional displacement values w occurring according to a change in a tilt of the chuck, lifts down the Z-axis stage, and after that, corrects an eccentric load of the chuck by driving the actuators of the tilt correction unit according to the driving amounts, and controls movement of the XY-axis stage by using the X and Y directional displacement values w. Accordingly, it is possible to accurately sense an eccentric load occurring at the time of performing the overdriving, and it is possible to rapidly and accurately perform initial setting for the eccentric load by adjusting a tilt of the chuck, so that it is possible to reduce a read time of a testing process.

14 Claims, 8 Drawing Sheets

(56) References Cited

U.S. PATENT DOCUMENTS

| | | | |
|---|---|---|---|
| 5,410,259 A * | 4/1995 | Fujihara et al. | 324/750.23 |
| 5,825,192 A | 10/1998 | Hagihara | |
| 6,297,656 B1 * | 10/2001 | Kobayashi et al. | 324/750.19 |
| 7,332,918 B2 * | 2/2008 | Sugiyama et al. | 324/750.03 |
| 2003/0201765 A1 * | 10/2003 | Takekoshi | 324/158.1 |
| 2008/0231300 A1 * | 9/2008 | Yamada et al. | 324/758 |

FOREIGN PATENT DOCUMENTS

| | | |
|---|---|---|
| KR | 10-1999-0008476 | 3/1999 |
| KR | 10-2000-0002612 | 1/2000 |
| KR | 10-2007-0080165 | 8/2007 |

* cited by examiner

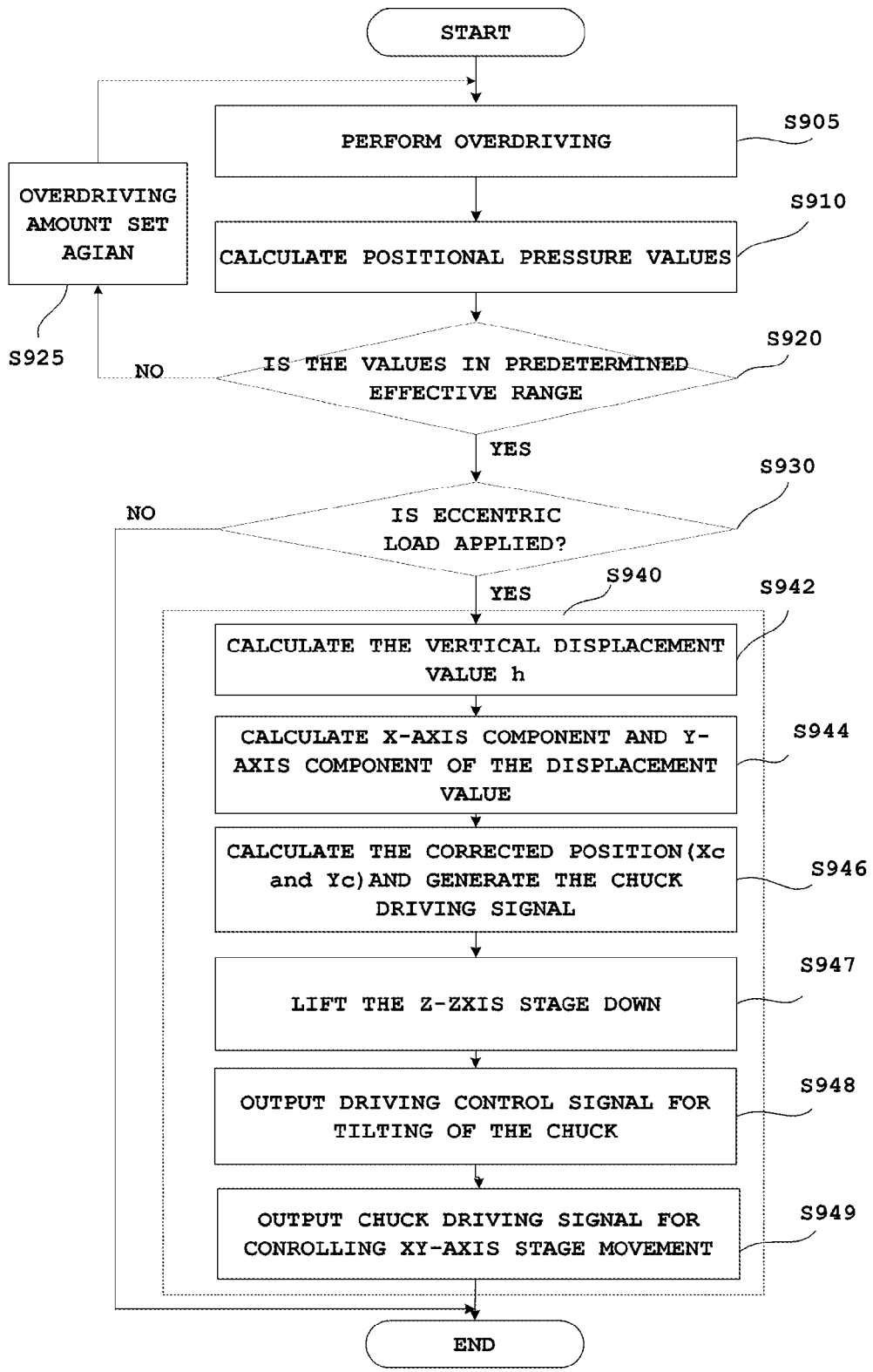

WAFER PROBE STATION CAPABLE OF ACTIVELY CONTROLLING TILT OF CHUCK AND CONTROLLING METHOD THEREOF

BACKGROUND

1. Field of the Invention

The present invention relates to a wafer probe station, and more particularly, to a wafer probe station where a tilt of a chuck is controlled so as to allow a uniform load to be applied to the chuck in the case where an eccentric load is applied to the chuck due to overdriving.

2. Background of the Invention

As illustrated in FIG. 1, a wafer probe station in the related art includes a probe unit 11 including a tester 12 which tests a wafer W, a chuck 16 which the wafer W is mounted on, a chuck transporting unit 17 which moves the chuck 16, and a control unit 18 which controls overall operations.

In the wafer probe station 10 in the related art, in the case where a probe card 14 used for the testing is fixed to a DUT board 13 of the wafer probe station 10, the wafer probe station 10 checks positions of contact electrodes P on the wafer and positions of probes 15 of the probe card by using a vision sensor (not shown) such as a CCD camera and controls the probe card 14 and the chuck 16 based on the checked position information. Next, the control unit 18 of the wafer probe station 10 drives the chuck transporting unit 17 based on the checked position information to transport the chuck 16 to a predetermined position so that the probes 15 of the probe card 14 and the contact electrodes P of the wafer mounted on the chuck 16 face each other before the contact for the testing. Next, the control unit 18 of the wafer probe station 10 performs predetermined overdriving control to electrically connect the contact electrodes P of the wafer to the probes 15 through contact there between. In an ideal case, due to the overdriving control, the wafer probe station 10 allows the wafer W mounted on the chuck 16 and the probe card 14 to be in uniform contact with each other by an appropriate pressure.

However, in the wafer probe station 10, due to an error in the mechanical accuracy and external disturbance, it is actually difficult to maintain the wafer W mounted on the chuck 16 and the probe card 14 in a prefect contact state. In this state, although the chuck 16 is lifted up to a height corresponding to the predetermined overdriving amount, a specific position of the wafer may be pressed too deeply, so that the wafer W is impaired, or a specific position may not be correctly pressed, so that there is a problem in that it is impossible to perform normal testing due to the occurrence of 'open failure' where the probe 15 and the contact electrode P are not in contact with each other.

In order to solve this problem, in the wafer probe station 10 of the related art, after the wafer and the probe card 14 are in contact with each other, the state of marks pressed on the wafer is visually tested, or the probe card 14 and the chuck 16 on which the wafer W is loaded are adjusted by using a vision sensor.

However, the adjusting method in the related art has a problem in that accurate adjustment cannot be easily performed due to limitation of the control method using a visual sensing result, so that reliability of the testing deteriorates and a problem in that the time taken for the adjustment is elongated, so that the read time of the testing process is increased. In addition, recently, since the size of the wafer W and the degree of integration of parts tend to be further increased, so that the problem according to initial settings of the wafer W with respect to the probe card 14 described above is much worse.

SUMMARY OF THE INVENTION

The present invention is to provide a wafer probe station capable of controlling a tilt of a chuck so that a uniform load is applied to the chuck in the case where an eccentric load is applied to some regions of the chuck at the time of performing overdriving.

The present invention is to provide a wafer probe station capable of controlling a tilt of a chuck so that a uniform load is applied to the chuck and accurately performing overdriving by correcting X and Y directional errors occurring according to the control of the tilt in the case where an eccentric load is applied to some regions of the chuck at the time of performing the overdriving.

According to a first aspect of the present invention, there is provided is a wafer probe station including a chuck where a wafer is mounted, a chuck transporting unit which supports and transports the chuck, and a probe card for testing the wafer, wherein the wafer probe station includes: a plurality of the pressure sensors which are disposed under portions of the chuck transporting unit for supporting the chuck in a vertical direction; a tilt correction unit which is constructed with a plurality of actuators which are disposed under the portions for supporting the chuck in the vertical direction, a plurality of displacement sensors which are disposed at positions adjacent to the corresponding actuators, and a microcomputer which controls operations of the actuators and the displacement sensors; and a control unit which allows the wafer to become in contact with the probe card by lifting up a Z-axis stage by a predetermined overdriving amount, detects pressure values of the installation positions from the pressure sensors, calculates driving amounts of the actuators of the tilt correction unit by using the pressure values so that a uniform load is applied to the chuck, lifts down the Z-axis stage, and after that, corrects an eccentric load of the chuck by driving the actuators of the tilt correction unit according to the driving amounts.

In the wafer probe station according to the first aspect of the present invention, it is preferable that, in order to calculate the driving amounts of the actuators of the tilt correction unit so that a uniform load is applied to the chuck, the control unit detects a maximum pressure value and a minimum pressure value among the pressure values according to the positions of the chuck, calculates a vertical displacement value h through the following Equation by using the maximum pressure value and the minimum pressure value, and generates the driving amounts of the actuators of the tilt correction unit by using the vertical displacement value h.

$$h=\{\text{ovr}/(W\text{max}/W\text{min})\}\times T_{\!f\!f}$$

Herein, h is the vertical displacement value, ovr is the overdriving amount, Wmax is the maximum eccentric load (maximum pressure value), Wmin is the minimum eccentric load (minimum pressure value), and $T_{\!f\!f}$ is a tilt correcting offset.

According to a second aspect of the present invention, there is provided is a wafer probe station including a chuck where a wafer is mounted, a chuck transporting unit which supports and transports the chuck, and a probe card for testing a wafer, wherein the wafer probe station includes: a plurality of the pressure sensors which are disposed under portions of the chuck transporting unit for supporting the chuck in a vertical direction; a tilt correction unit which is constructed with a plurality of actuators which are disposed under the portions for supporting the chuck in the vertical direction, a plurality of displacement sensors which are disposed at positions adjacent to the corresponding actuators, and a microcomputer which controls operations of the actuators and the displacement sensors; and a control unit which allows the wafer to become in contact with the probe card by lifting up a Z-axis stage by a predetermined overdriving amount, extracts the pressure values of the installation positions from the pressure sensors, calculates driving amounts of the actuators of the tilt correction unit by using the pressure values so that a uniform load is applied to the chuck, calculates X and Y directional displacement values w occurring according to a change in a tilt of the chuck, lifts down the Z-axis stage, and after that, corrects an eccentric load of the chuck by driving the actuators of the tilt correction unit according to the driving amounts, and controls movement of the XY-axis stage by using the X and Y directional displacement values w In the wafer probe station according to the first and second aspects of the present invention, it is preferable that, in a case where a maximum pressure value among the pressure values deviates from a predetermined effective range, the control unit sets the overdriving amount again and performs overdriving according to the newly-set overdriving amount.

In the wafer probe station according to the second aspect of the present invention, it is preferable that, in order to calculate the driving amounts of the actuators of the tilt correction unit so that a uniform load is applied to the chuck, the control unit detects a maximum pressure value and a minimum pressure value among the pressure values according to the positions of the chuck, calculates a vertical displacement value h through the following Equation (i) by using the maximum pressure value and the minimum pressure value, determining the driving amounts of the actuators of the tilt correction unit by using the vertical displacement value h to generate a driving control signal for each of the actuators, and controls driving of the actuators of the tilt correction unit according to the driving control signal, and the control unit calculates X and Y directional displacement values w according to the vertical displacement value through the following Equation (ii), extracts an X-axis component $\Delta x$ and a Y-axis component $\Delta y$ of the displacement value from the X and Y directional displacement values w, calculates corrected position (Xc, Yc) of the XY-axis stage through the following Equation (iii) to generate a chuck driving signal of the chuck transporting unit, and controls movement of the XY-axis stage of the chuck transporting unit according to the chuck driving signal.

$$h = \{ovr/(W\max/W\min)\} \times T_{\!f} \quad \text{Equation (i)}$$

wherein h is the vertical displacement value, ovr is the overdriving amount, Wmax is the maximum eccentric load (maximum pressure value), Wmin is the minimum eccentric load (minimum pressure value), and $T_{\!f}$ is a tilt correcting offset.

$$w = r - \sqrt{r^2 - h^2} \quad \text{Equation (ii)}$$

wherein, w is the displacement value, r is a distance from a center of a rotation axis to an end point of the chuck surface, and h: the vertical displacement value.

$$Xc = x - \Delta x,$$

$$Yc = y - \Delta y \quad \text{Equation (iii)}$$

wherein x is a current position value of the X-axis stage, y is a current position value of the Y-axis stage, $\Delta x$ is the X-axis component (=w cos θ) of w, and $\Delta y$ is the Y-axis component (=w sin θ) of w.

In the wafer probe station according to the first and second aspects of the present invention, it is preferable that, the microcomputer of the tilt correction unit receives the driving control signal for each of the actuators as an input from the control unit, drives each of the actuators according to the driving control signal, and performs feedback control of the driving of each of the actuators by using displacement information input from each of the displacement sensors.

In the wafer probe station according to the second aspect of the present invention, t is preferable that the wafer probe station sets and stores X and Y directional position errors $\Delta P$ occurring due to mechanical characteristics of the actuator in advance, and the control unit controls the movement of the XY-axis stage of the chuck transporting unit so as to correct the X and Y directional position errors due to the actuator.

According to a third aspect of the present invention, there is provided is a control method in a wafer probe station including a chuck where a wafer is mounted, a chuck transporting unit which supports and transports the chuck, a tilt correction unit which adjusts a tilt of the chuck by a plurality of actuators which are disposed under portions for supporting the chuck in a vertical direction, a probe card which is installed to be aligned for testing the wafer, a plurality of the pressure sensors which are disposed under the portions for supporting the chuck in the vertical direction, and a control unit which controls the chuck transporting unit so that the chuck where the wafer is mounted performs overdriving, comprising steps of: (a) lifting up a Z-axis stage by a predetermined overdriving amount and, after that, detecting positional pressure values from the pressure sensors; (b) calculating a vertical displacement value h by using a maximum pressure value and a minimum pressure value among the positional pressure values in the case where it is determined based on the positional pressure values that an eccentric load occurs in the chuck; (c) calculating driving amounts of the actuators of the tilt correction unit by using the vertical displacement value so that a uniform load is applied to the chuck; (d) calculating X and Y directional displacement values w occurring in the X and Y directions of the chuck according to the vertical displacement value; and (e) lifting down the Z-axis stage, correcting the eccentric load of the chuck by controlling the driving of the actuators according to the driving amounts, and controlling movement of an XY-axis stage by using the X and Y directional displacement values w.

As described above, in the wafer probe station according to the present invention, the pressure exerted on the wafer at the time of performing the overdriving is sensed, and the sensed pressure value is adjusted so that an optimized value of the overdriving amount is provided, so that it is possible to safely and rapidly perform initial setting of the wafer in comparison with a conventional technique.

In addition, in the wafer probe station according to the present invention, the pressure exerted on the wafer at the time of performing the overdriving is sensed, so that it is possible to accurately and easily performing the direct sensing in comparison with a conventional case using a vision sensor. Therefore, it is possible to rapidly perform diagnosis of an error such as an eccentric load occurring at the time of performing the overdriving.

In addition, in the wafer probe station according to the present invention, the tilt correction unit is adjusted according to the error of the eccentric load, so that it is possible to minimize the error of the eccentric load on the wafer occurring due to deformation or the like of the probe card.

In addition, in the wafer probe station according to the present invention, by correcting the positional error of the contact point according to geometrical and mechanical contacts occurring due to change in the tilt of the chuck, it is possible to perform initial setting of the wafer capable of minimizing the contact error in comparison with a conventional technique.

BRIEF DESCRIPTION OF THE DRAWINGS

FIG. 8 is a flowchart for explaining operations of a control unit according to an embodiment.

DETAILED DESCRIPTION

According to the present invention, provided is a wafer probe station including a chuck where a wafer is mounted, a chuck transporting unit which supports and transports the chuck, and a probe card for testing the wafer, wherein the wafer probe station includes a plurality of the pressure sensors which are disposed under portions of the chuck transporting unit for supporting the chuck in a vertical direction; a tilt correction unit which is constructed with a plurality of actuators which are disposed under the portions for supporting the chuck in the vertical direction, a plurality of displacement sensors which are disposed at positions adjacent to the corresponding actuators, and a microcomputer which controls operations of the actuators and the displacement sensors; and a control unit which allows the wafer to be come in contact with the probe card by lifting up a Z-axis stage by a predetermined overdriving amount, detects pressure values of the installation positions from the pressure sensors, calculates driving amounts of the actuators of the tilt correction unit by using the pressure values so that a uniform load is applied to the chuck, lifts down the Z-axis stage, and after that, corrects an eccentric load of the chuck by driving the actuators of the tilt correction unit according to the driving amounts.

Hereinafter, a wafer probe station according to an embodiment will be described in detail with reference to the accompanying drawings.

Figure 1:
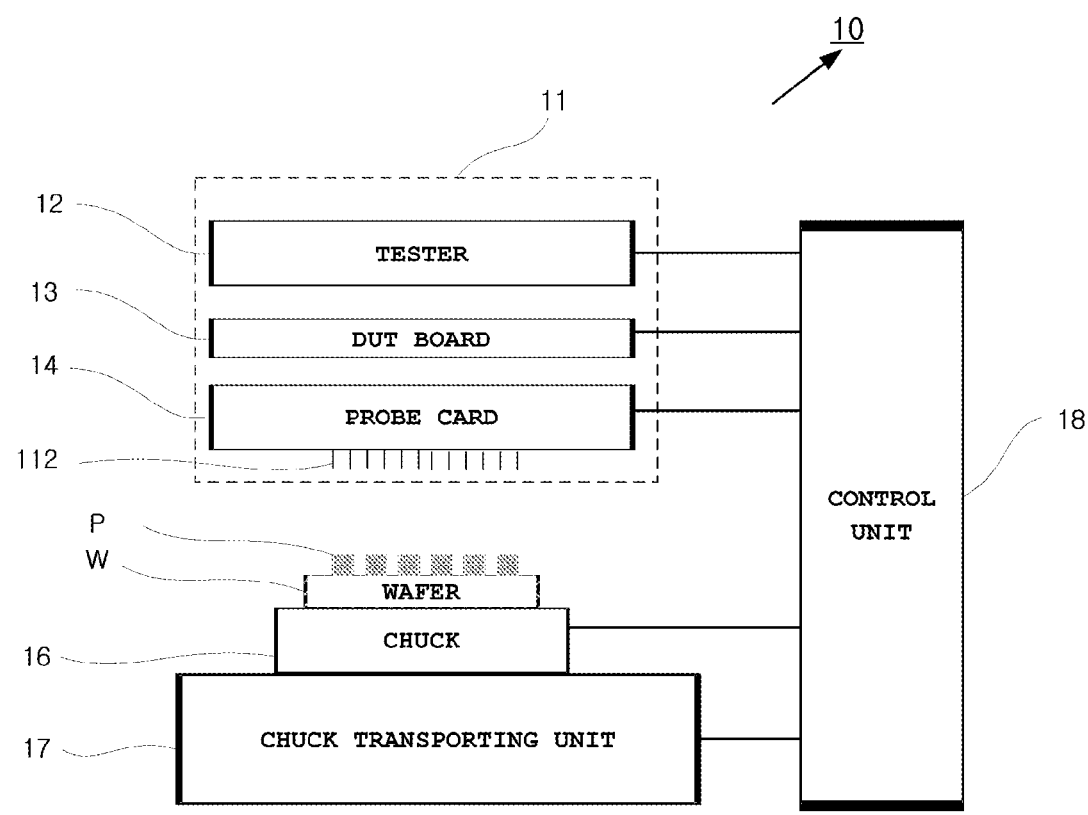
FIG. 1 is a block diagram illustrating a conventional wafer probe station.
Figure 2:
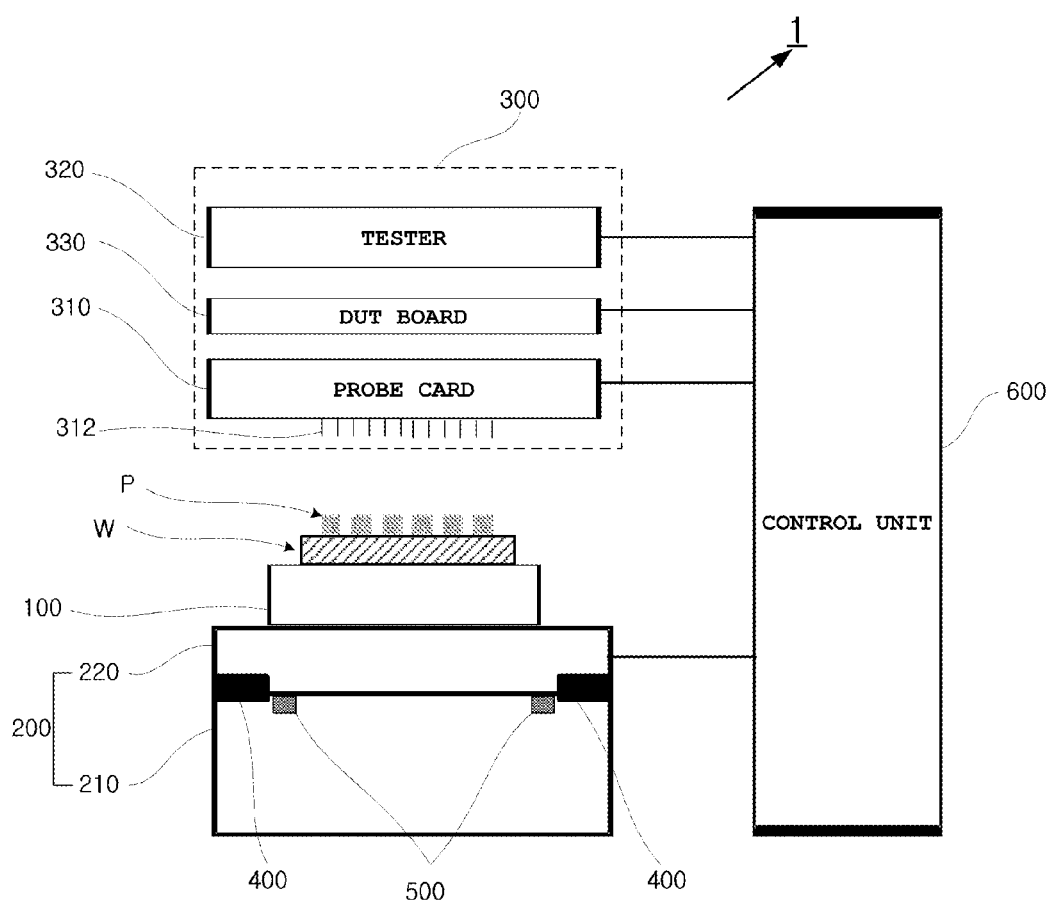
FIG. 2 is a block diagram illustrating a wafer probe station according to an embodiment.
Figure 3:
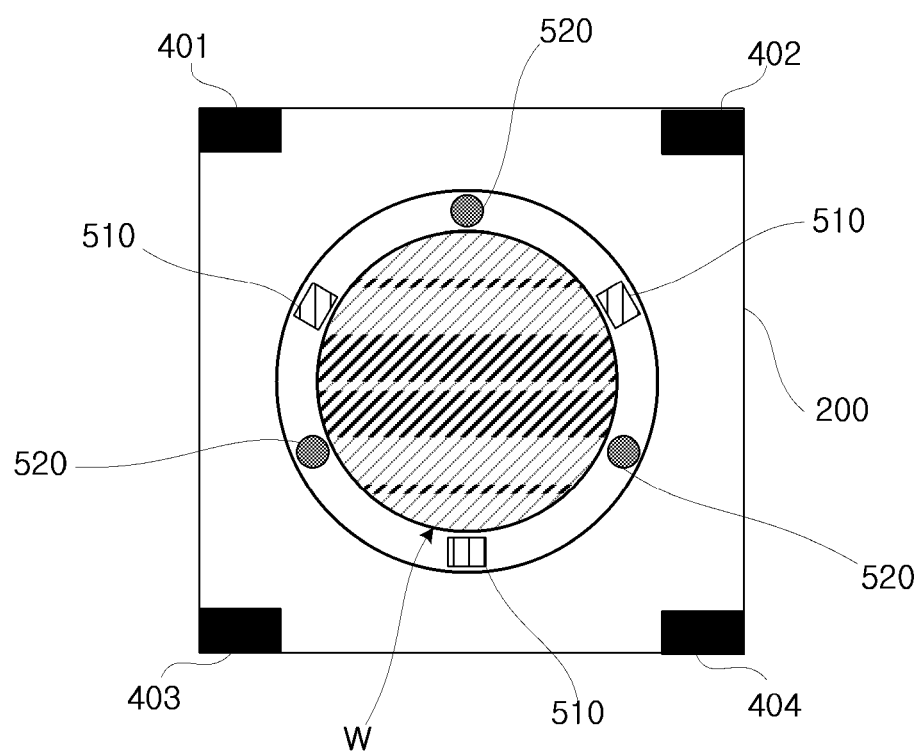
FIG. 3 is a diagram illustrating positions of pressure sensors and a tilt correction unit according to an embodiment.
Figure 4:
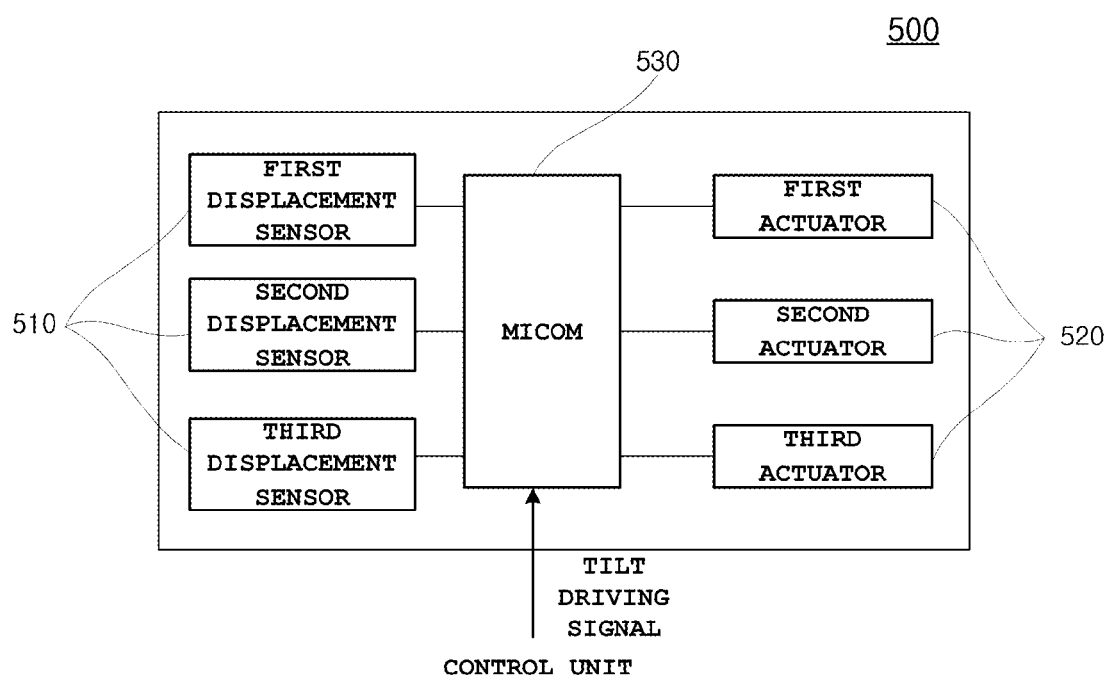
FIG. 4 is a block diagram illustrating a tilt correction unit according to an embodiment.
Figure 5:
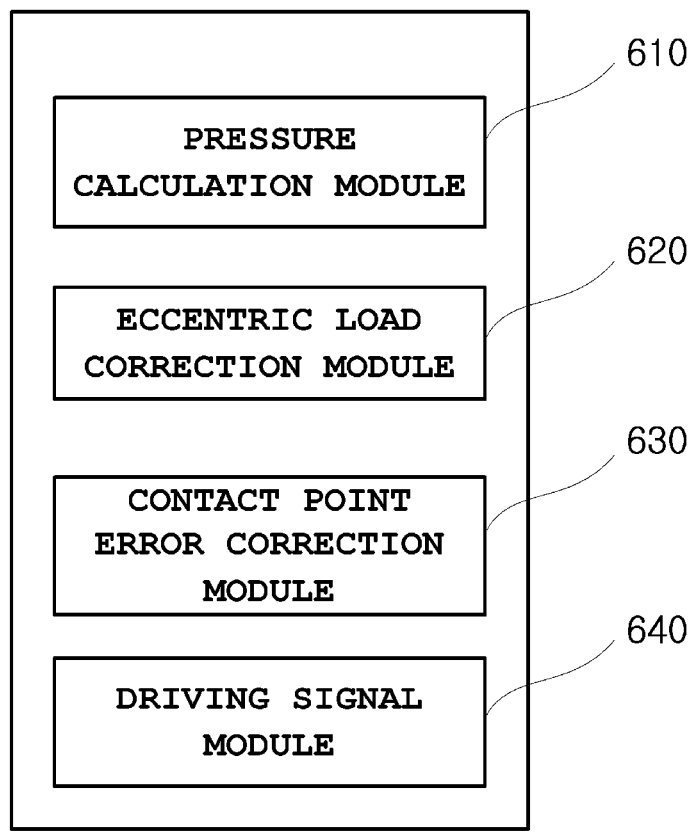
FIG. 5 is a block diagram illustrating a control unit according to an embodiment.

The wafer probe station according to the embodiment will be described with reference to FIGS. 2 to 5. FIG. 2 is a block diagram illustrating the wafer probe station according to the embodiment. FIG. 3 is a diagram illustrating positions of pressure sensors and a tilt correction unit according to the embodiment. FIG. 4 is a block diagram illustrating a tilt correction unit according to the embodiment. FIG. 5 is a block diagram illustrating a control unit according to the embodiment.

As illustrated in FIG. 2, the wafer probe station 1 includes a chuck 100 where a wafer W is mounted, a chuck transporting unit 200, a probe unit 300, a pressure sensor 400, a tilt correction unit 500, and a control unit 600. First, schematic operations of the wafer probe station 1 are described. The wafer probe station 1 detects position information of the probes 312 and position information of the contact electrodes P by using a vision sensor (not shown) such as a CCD camera and initially aligns a probe card 310 with the wafer based on the detected position information of the probes 312 and the detected position information of the contact electrodes P. Next, the wafer probe station 1 allows the wafer to be come in contact with the probe card by lifting up a Z-axis stage and detects an eccentric load applied to the wafer W by using a value sensed by the pressure sensor 400. Next, a tilt of the chuck 100 is adjusted to correct the eccentric load in order to allow a uniform load to be applied to the chuck. Next, the wafer probe station 1 calculates the position error in the X and Y directions generated according to the adjustment of the tilt and controls the movement of the XY-axis stage, so that overdriving can be accurately performed.

Next, the configuration of the wafer probe station 1 according to the present invention will be described in detail with reference to FIGS. 2 to 5. The wafer W is mounted on the chuck 100, and the chuck 100 is moved in the X, Y, and Z axes by the driving of the chuck transporting unit 200.

The chuck transporting unit 200 transports the chuck 100 by the control of the control unit 600. As illustrated in FIG. 2, the chuck transporting unit 200 includes an XY-axis stage 210 which moves in a plane and a Z-axis stage 220 which is disposed above the XY-axis stage 210 to move the chuck 100 in the up and down directions. In addition, the chuck transporting unit 200 may also rotate the chuck 100 with respect to the Z axis. Since the configuration and operations of the chuck transporting unit 200 are well known, the detailed description thereof is omitted.

As illustrated in FIG. 2, the probe unit 300 includes a probe card 310, a tester 320, and a DUT board 330. The probe card 310 includes a probe 312 which comes in electrical contact with the wafer in order to test the wafer W. The tester 320 is operated in cooperation with the probe card 310 to execute various programs for detecting defects of the wafer W. The DUT board 330 functions as an interface connecting the tester 320 and the probe card 310.

As illustrated in FIGS. 2 and 3, the pressure sensors 400 are disposed between the Z-axis stage 220 and the XY-axis stage 210. In other words, the pressure sensors 400 are disposed under the Z-axis stage 220 which is a mechanical portion for supporting the chuck 100 in the vertical direction in order to sense pressures corresponding to loads applied to the installation positions of the chuck 100. In addition, the pressure sensors 400 include a first pressure sensor 401, a second pressure sensor 402, a third pressure sensor 403, and a fourth pressure sensor 404. As illustrated in FIG. 3, the pressure sensors 400 are disposed at edge positions corresponding to four directions by using a predetermined direction as a reference. It is preferable that the reference positions of the pressure sensors 400 are determined by using a XY coordinate system used for driving the chuck transporting unit 200 as a reference by taking into consideration that signals sensed by the pressure sensor 400 are used to calculate a control signal for driving the chuck transporting unit 200.

As illustrated in FIG. 3, among the pressure sensors 400, the first pressure sensor 401 and the second pressure sensor 402 are disposed at the left-side and right-side edges in the X-axis and the backward Y-axis direction among the four directions, and the third pressure sensor 403 and the fourth pressure sensor 404 are disposed at the left-side and right-side edges in the X-axis and the forward Y-axis direction. The four pressure sensors 400 are disposed at protrusions which are formed to protrude from the four edges of the upper surface of the XY-axis stage 210. In the four edges of the lower surface of the Z-axis stage 220, grooves are formed so as to allow the protrusions where the first to fourth pressure sensors 401, 402, 403, and 404 are disposed to be inserted therein. In other words, the pressure sensors 400 are disposed between the grooves of the Z-axis stage 220 and the protrusions of the XY-axis stage 210. The pressure sensors 400 senses a pressure which is vertically exerted to the four edges of the Z-axis stage 220 and outputs a corresponding signal to the control unit 600. Herein, a load cell, a displacement meter, a strain gauge, a capacitor sensor, and the like may be used as the pressure sensor 400.

As illustrated in FIG. 4, the tilt correction unit 500 includes first to third displacement sensors 510, first to third actuators 520, and a microcomputer 530. Herein, as illustrated in FIGS. 2 and 3, the first to third displacement sensors 510 and the first to third actuators 520 are disposed by a uniform angle around the outer circumference between the Z-axis stage 220 and the XY-axis stage 210. Each of the first to third displacement sensors 510 senses a vertical displacement between the Z-axis stage 220 and the XY-axis stage 210 at the installation position thereof and transmits the vertical displacement information to the microcomputer 530.

The microcomputer 530 executes a feedback control algorithm using the information transmitted from each of the displacement sensors 510 as a feedback signal so that each of the actuators 520 is driven according to the driving control signal for each of the actuators 520 transmitted from the control unit 600. Herein, the microcomputer 530 includes a communication module (not shown) which performs data transmission and reception with respect to the control unit 600, an ADC (not shown) which converts the signal sensed by each of the displacement sensors 510, and a DAC (not shown) which outputs signals for driving each of the actuators 520. The feedback control algorithm is mainly configured in a form of a PID controller.

In other words, the microcomputer 530 drives the first to third actuators according to the driving control signal for the first to third actuators supplied from the control unit and feedback-controls the first to third actuators by using the displacement information input from the first to third displacement sensors, so that the first to third actuators can be accurately driven according to the driving control signal supplied from the control unit.

Each of the first to third actuators 520 adjusts the vertical displacement between the XY-axis stage 210 and the Z-axis stage 220 under the control of the microcomputer 530, so that the tilt of the chuck 100 can be adjusted.

Figure 6:
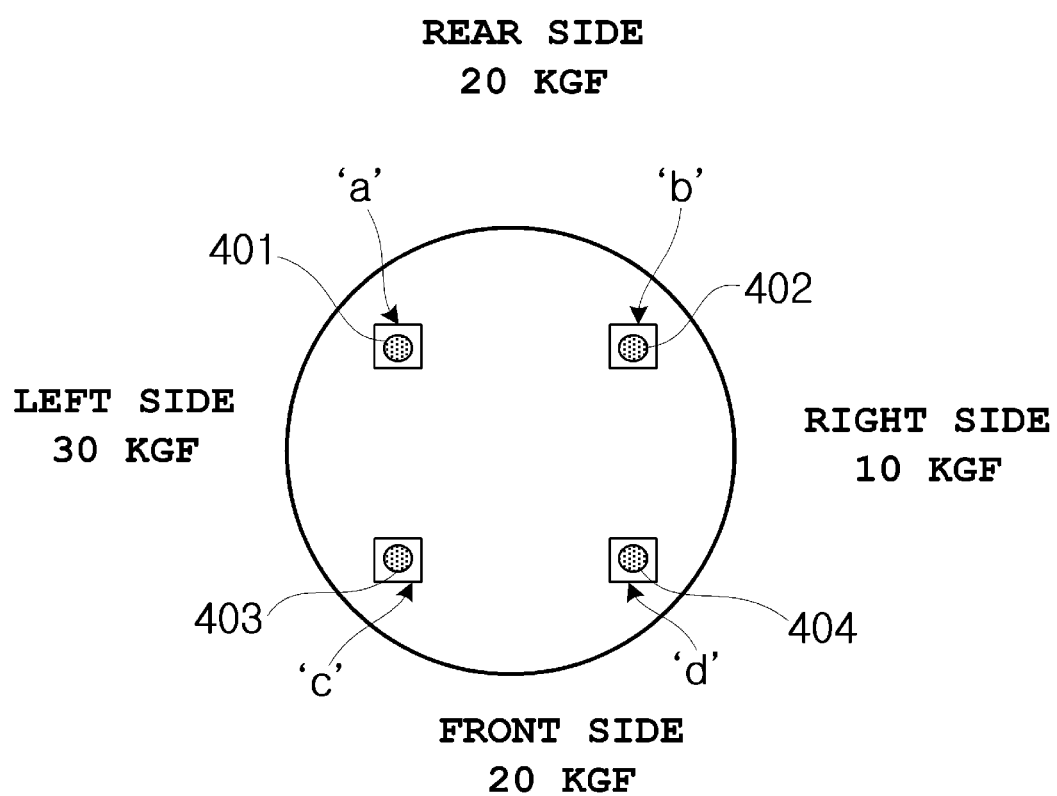
FIG. 6 is a diagram for explaining a pressure calculation module and an eccentric load correction module illustrated in FIG. 5.
Figure 7:
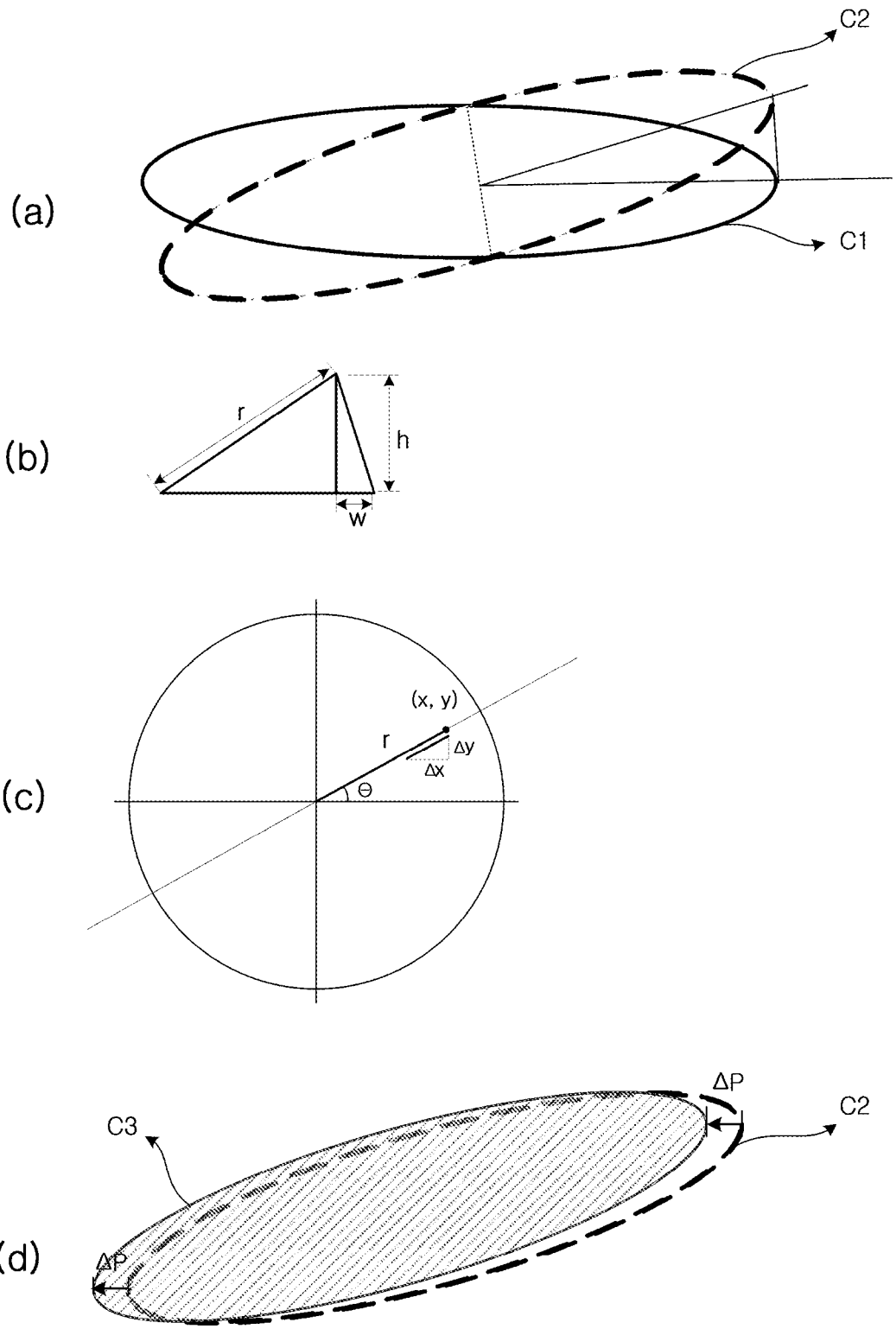
FIG. 7 is a diagram for explaining a contact point error correction module illustrated in FIG. 5.

The control unit 600 will be described in detail with reference to FIGS. 5 to 7. FIG. 5 is a block diagram illustrating the control unit according to the present invention. FIG. 6 is a diagram for explaining operations of a pressure calculation module and an eccentric load correction module illustrated in FIG. 5. FIG. 7 is a diagram for explaining a contact point error correction module illustrated in FIG. 5.

As illustrated in FIG. 5, the control unit 600 includes a pressure calculation module 610, an eccentric load correction module 620, a contact point error correction module 630, and a driving signal module 640. The control unit lifts up the Z-axis stage to be overdriven, and after that, measures a distribution of the pressure applied to the chuck by using the pressure calculation module 610. The control unit generates the driving control signal for the actuators for correcting the tilt of the chuck so that the uniform load is applied to the chuck through the eccentric load correction module 620. The control unit generates the chuck driving signal of the chuck transporting unit for correcting the position error in the X and Y directions according to the change in the tilt of the chuck through the contact point error correction module 630. The control unit controls the movement of the actuators and the XY-axis stage by using the driving control signal and the chuck driving signal through the driving signal module 640. Hereinafter, operations of the modules of the control unit will be described in detail.

In the case where the overdriving is performed according to the predetermined overdriving amount, the pressure calculation module 610 is input with the pressure values of the installation positions from the pressure sensors 400, and a distribution of the pressures applied to the surface of the wafer W is extracted by using the pressure values of the installation positions. In other words, the left side pressure value applied to the left side of the chuck 100 is calculated by using the values sensed from the first pressure sensor 401 and the third pressure sensor 403; the right side pressure value applied to the right side of the chuck 100 is calculated by using the values sensed from the second pressure sensor 402 and the fourth pressure sensor 404; the rear-side pressure value applied to the rear side of the chuck 100 is calculated by using the values sensed from the first pressure sensor 401 and the second pressure sensor 402; and the front-side pressure value applied to the front side of the chuck 100 is calculated by using the values sensed from the third pressure sensor 403 and the fourth pressure sensor 404. The positional pressure values constituting the pressure distribution may be calculated by various methods. For example, the pressure value in each direction can be obtained by multiplying addition of the sensed values of the pressure sensors 400 disposed at the positions corresponding to the respective direction with an appropriate constant value which reflects an area of a region of the wafer W.

In other words, the left side pressure value may be calculated by multiplying a sum of the pressure values sensed by the first pressure sensor 401 and the third pressure sensor 403 with a predetermined constant; the right side pressure value may be calculated by multiplying a sum of the pressure values sensed by the second pressure sensor 402 and the fourth pressure sensor 404 with a predetermined constant; the rear-side pressure value may be calculated by multiplying a sum of the pressure values sensed by the first pressure sensor 401 and the second pressure sensor 402 with a predetermined constant and the front-side pressure value may be calculated by multiplying a sum of the pressure values sensed by the third pressure sensor 403 and the fourth pressure sensor 404 with a predetermined constant.

The pressure calculation module 610 will be described with reference to FIG. 6. FIG. 6 illustrates the positional pressure values calculated by the pressure calculation module 610 at the positions where the pressure sensors 400 are installed. As illustrated in FIG. 6, in the case where the overdriving of 50 μm is performed by the control unit 600, as the pressure values at the positions calculated by the pressure calculation module 610, the left side pressure value is 30 kgf, the right side pressure value is 10 kgf; and the front-side and rear-side pressure values are 20 kgf. The positional pressure values are calculated in the assumption that the pressure values sensed by the first and third pressure sensors 401 and 403 corresponding to the positions 'a' and 'c' are 3 kgf, the pressure values sensed by the second and fourth pressure sensors 402 and 404 corresponding to the positions 'b' and 'd' are 1 kgf, and the predetermined constant value is '5'. For example, the left side pressure value of 30 kgf is calculated by multiplying the sum of 3 kgf sensed by the first pressure sensor 401 and 3 kgf sensed by the third pressure sensor 403 with the predetermined constant value of 5.

First, the eccentric load correction module 620 determines whether or not the maximum value of the positional pressure values calculated by the pressure calculation module 610 reaches a predetermined effective range. If the maximum value of the pressure values calculated at the positions is not included in the effective range, the overdriving amount is set again by taking into consideration a degree of the difference of the maximum value from the effective range, and the overdriving is performed again according to the newly-set overdriving amount. Herein, the effective range is defined as a predetermined standard deviation range of the reference pressure value.

If the maximum value is included in the effective range, the eccentric load correction module determines whether or not an eccentric load is applied to the chuck. If the eccentric load is applied, the eccentric load correction module calculates a vertical displacement value h in order to correct the eccentric load. The vertical displacement value h for correcting the eccentric load is calculated by the following Equation 1. A tilt correcting offset (Tff) is a constant value which is appropriately selected to obtain the vertical displacement value h which is changed according to mechanical characteristics of the wafer probe station 1 according to the present invention.

$$h = ovr/(Wmax/Wmin) \times T_{ff}$$ [Equation 1]

Herein, h is the vertical displacement value, ovr is the overdriving amount, Wmax is the maximum eccentric load, Wmin is the minimum eccentric load, and $T_{ff}$ is the tilt correcting offset.

As illustrated in FIG. 6, in the case where, as a result of the overdriving of 50 μm performed by the control unit 600, the left side pressure value is 30 kgf and the right side pressure value is 10 kgf, The contact load of the probe card 310 applied to the left side surface of the chuck 100 is three times larger than the contact load applied to the right side surface of the chuck 100. In this case, it may be understood that the contact to the left side surface of the wafer W is started from the position where the overdriving is 0 μm, and the contact to the right side surface of the wafer W is started from the position where the overdriving is 50/3 μm. Therefore, the right side surface of the chuck 100 needs to be lifted by 50/3 μm in the vertical direction in order to correct the eccentric load applied to the left side surface. Herein, 50/3 μm becomes the vertical displacement value h for correcting the eccentric load.

The eccentric load correction module 620 determines the driving amounts of the actuators based on the vertical displacement value h and generates the driving control signals for the actuators according to the driving amounts.

On the other hand, if the tilt of the chuck 100 is changed, the position errors in the X and Y directions occur at the contact point between the probe 312 and the contact electrode P. The contact point error correction module 630 is configured to correct the position errors in the X and Y directions. The value of the contact point error includes a first displacement value w and a second displacement value ΔP. The method of calculating the first displacement value w is described with reference to (a), (b), and (c) of FIG. 7. The first displacement value w is a position error occurring due to a geometrical change in the tilt of the chuck 100. For example, in the case where the tilt is changed by the movement of the chuck 100 from the position C1 to the position C2 in (a) of FIG. 2, first displacement value w occurs. As illustrated in FIG. 6, in the case where, a result of application of the eccentric load to the left side surface of the chuck 100, the vertical displacement value for correcting the eccentric load described above becomes 'h', as illustrated by C2 of (a) of FIG. 7, the right side surface edge of the chuck 100 is lifted up by the vertical displacement value h with respect to the Z axis fixed to the center of the chuck 100, and the left side surface edge is lifted down by the vertical displacement value h. The first displacement value w occurring due to the tilt of the chuck 100 can be calculated by the following Equation 2 from (b) and (c) of FIG. 7.

$$w = r - \sqrt{r^2 - h^2}$$ [Equation 2]

Herein, w is the first displacement value, r is a distance from the center of the rotation axis to the end point of the surface of the chuck, and h is the vertical displacement value.

As illustrated in (c) of FIG. 7, the X and Y components of the first displacement value w calculated by Equation 2 are expressed by the following Equation 3.

$$\Delta x = -w \times \cos \theta$$

$$\Delta y = -w \times \sin \theta$$ [Equation 2]

As illustrated in (d) of FIG. 7, the second displacement value ΔP occurs due to the movement of the chuck 100 from the position C2 to the position C3, which is caused from one-directional bias of the Z-axis stage 220 by a mechanical force exerted between each of the actuators 520 and the Z-axis stage 220 to adjust the tilt of the chuck 100. The X and Y-axis components of the second displacement value ΔP are defined by ΔPx and ΔPy, respectively.

Therefore, the corrected position (Xc, Yc) of the chuck 100 in the X and Y axes for correcting the position error at the contact point occurring due to the tilt of the chuck 100 can be calculated by the following Equation 4.

$$Xc = x + \Delta x + \Delta Px$$

$$Yc = y + \Delta y + \Delta Py$$ [Equation 2]

Herein, x is the current X-axis coordinate value and y is the current Y-axis coordinate value.

The driving signal module 640 generates the driving control signal for each of the actuators to output the driving control signal to the tilt correction unit 500 and outputs the chuck driving signal corresponding to the X-axis and Y-axis components Xc and Yc of the corrected position to the chuck transporting unit 200.

Hereinafter, the operations of the wafer probe station according to the embodiment will be described in detail with reference to FIG. 8. FIG. 8 is a flowchart for explaining a sequence of the operations of the control unit of the wafer probe station according to the embodiment.

First, the control unit 600 performs overdriving according to a predetermined overdriving amount (Step S905). The control unit 600 calculates positional pressure values applied to the wafer W by the probe card 310 at the positions where the pressure sensors 400 are installed by using signals sensed and transmitted by the pressure sensors 400 (Step S910). As illustrated in FIG. 6, as a result of the calculation of the positional pressure values, the left side pressure value is 30 kgf, the right side pressure value is 10 kgf, and the front-side and rear-side pressure values are 20 kgf.

Next, it is determined whether or not the maximum value of the calculated positional pressure values reaches the predetermined effective range (Step S920). As a result of the determination, if the maximum value of the calculated positional pressure values does not reach the effective range or exceeds the effective range, the Z-axis stage is lifted down, and after that, the overdriving amount is set again by taking into consideration a value of the difference of the maximum value from the effective range, and the overdriving is performed again according to the newly-set overdriving amount (Step S925). Herein, effective range may be defined as a predetermined standard deviation range of the reference pressure value.

Next, as a result of the determination of Step S920, if the maximum value of the calculated positional pressure values reaches the effective range, it is determined based on the calculated positional pressure values whether or not an eccentric load is applied to the chuck 100 due to the overdriving (Step S930). As a result of the determination, in the case where it is determined that no eccentric load is applied to the chuck 100, since the tilt of the chuck 100 according to the embodiment needs not to be adjusted, the control process according to the embodiment is ended.

Next, as a result of the determination of Step S930, in the case where it is determined that an eccentric load is applied to the chuck 100, the control unit 600 generates the driving control signals for the first to third actuators for correcting the eccentric load by using the positional pressure values calculated in Step S910 to output the driving control signals to the tilt correction unit 500 and generates the chuck driving signal for correcting the position error at the contact point between the probe 312 and the contact electrode occurring due to the change in the tilt of the chuck 100 to output the chuck driving signal to the chuck transporting unit 200 (Step S940).

Now, Step S940 is described more in detail. First, the control unit 600 sets the position of the chuck 100 where the tilt needs to be adjusted and calculates the vertical displacement value h at the set position of the chuck 100 in order to correct the eccentric load applied to the chuck 100 (Step S942). Next, the control unit determines the driving amounts of the actuators by using the vertical displacement value h and generates the driving control signal for the actuators according to the driving amounts. The calculation of Step S942 is performed by the eccentric load correction module 620 of the control unit 600. In the example illustrated in FIG. 6, the position of the chuck 100 where the tilt needs to be adjusted is on the right side surface, and the value of 'h' is 50/3.

If the tilt of the chuck 100 is changed based on the vertical displacement value h calculated in Step S942, the position of the chuck in the X and Y directions is also changed. Therefore, in order to correct the error according to the change of the position of the chuck in the X and Y directions described above, the control unit generates the displacement value w occurring due to the change in the tilt in the X and Y directions and calculates the X-axis component ($\Delta x = w \times \cos \theta$) and the Y-axis component ($\Delta y = w \times \sin \theta$) of the displacement value w (Step S944). Next, as described above, by taking into consideration the position error w in the X and Y directions occurring due to the change in the tilt and the position error $\Delta P$ in the X and Y directions with respect to the actuators, the control unit calculates the corrected position (Xc and Yc) of the chuck 100 in the X and Y axes and generates the chuck driving signal for the XY-axis stage (Step S946).

On the other hand, since the central axis of the actuators and the central axis of the Z-axis stage are not accurately aligned, although the actuators are driven in the vertical direction, the chuck is also slightly moved in the X and Y directions besides the vertical direction. Therefore, the control unit according to the present invention reads the position error $\Delta P$ in the X and Y directions corresponding to the driving amounts of the actuators from the predetermined database and calculates the X-axis and Y-axis components $\Delta Px$ and $\Delta Py$ of the position error $\Delta P$ in the X and Y directions with respect to the actuators. Herein, the control unit drives the actuators in advance to measure the change of the positions in the X and Y directions according to the driving amounts of the actuators and sets the values $\Delta P$ of the position errors in the X and Y directions according to the driving amounts of the actuators by using the measured values of the changed positions to generate the database thereof.

Next, in order to drive the chuck 100 according to the vertical displacement value h and the X-axis and—axis Y coordinates Xc and Yc of the corrected position in the X and Y axes, the control unit 600 lifts the chuck 100 down in the Z-axis direction to separate the probe card 310 from the wafer W by a constant gap (Step S947).

Finally, the control unit 600 outputs the driving control signal for each of the actuators to the tilt correction unit 500 and controls the tilt of the chuck to correct the eccentric load applied to the chuck so that the uniform load is applied (Step S948). Next, the control unit outputs the chuck driving signal for the XY-axis stage to the chuck transporting unit 200 to control the movement in the X and Y axes and corrects the position error occurring at the contact point between the wafer and the probe card due to the change in the tilt, so that the wafer and the probe card come accurately in contact with each other (Step S949).

In addition, the wafer probe station 1 according to the embodiment senses the position and intensity of the eccentric load applied to the wafer W at the time of performing the overdriving and controls the tilt of the chuck 100 in order to remove the sensed eccentric load. The wafer probe station 1 moves the position of the chuck 100 in the X and Y axes in order to correct the position error at the contact point between the probe 312 and the contact electrode P according to the geometrical and mechanical contact occurring due to the change in the tilt of the chuck 100.

The wafer probe station according to the present invention can be useful for semiconductor testing of a wafer probe station using a probe card.

What is claimed is:

1. A wafer probe station including a chuck where a wafer is mounted, a chuck transporting unit which supports and transports the chuck, and a probe card for testing a wafer, comprising:
a plurality of the pressure sensors which are disposed under portions of the chuck transporting unit for supporting the chuck in a vertical direction;
a tilt correction unit which is constructed with a plurality of actuators which are disposed under the portions for supporting the chuck in the vertical direction, a plurality of displacement sensors which are disposed at positions adjacent to the corresponding actuators, and a microcomputer which controls operations of the actuators and the displacement sensors; and
a control unit which allows the wafer to be come in contact with the probe card by lifting up a Z-axis stage by a predetermined overdriving amount, detects pressure values of the installation positions from the pressure sensors, calculates driving amounts of the actuators of the tilt correction unit by using the pressure values so that a uniform load is applied to the chuck, lifts down the Z-axis stage, and after that, corrects an eccentric load of the chuck by driving the actuators of the tilt correction unit according to the driving amounts.

2. The wafer probe station according to claim 1, wherein in order to calculate the driving amounts of the actuators of the tilt correction unit so that a uniform load is applied to the chuck, the control unit detects a maximum pressure value and a minimum pressure value among the pressure values according to the positions of the chuck, calculates a vertical displacement value h through the following Equation (i) by using the maximum pressure value and the minimum pressure value, and generates the driving amounts of the actuators of the tilt correction unit by using the vertical displacement value h, $$h=\{ovr/(W\max/W\min)\}\times T_{\!f}\qquad\text{Equation (i)}$$

wherein h is the vertical displacement value, ovr is the overdriving amount, Wmax is the maximum eccentric load (maximum pressure value), Wmin is the minimum eccentric load (minimum pressure value), and $T_{\!f}$ is a tilt correcting offset.

3. The wafer probe station according to claim 1, wherein the control unit calculates X and Y directional displacement values w occurring according to a change in a tilt of the chuck, lifts down the Z-axis stage, and after that, corrects an eccentric load of the chuck by driving the actuators of the tilt correction unit according to the driving amounts, and controls movement of the XY-axis stage by using the X and Y directional displacement values w.

4. The wafer probe station according to claim 1, wherein in a case where a maximum pressure value among the pressure values deviates from a predetermined effective range, the control unit sets the overdriving amount again and performs overdriving according to the newly-set overdriving amount.

5. The wafer probe station according to claim 3,
wherein in order to calculate the driving amounts of the actuators of the tilt correction unit so that a uniform load is applied to the chuck, the control unit detects a maximum pressure value and a minimum pressure value among the pressure values according to the positions of the chuck, calculates a vertical displacement value h through the following Equation (i) by using the maximum pressure value and the minimum pressure value, determining the driving amounts of the actuators of the tilt correction unit by using the vertical displacement value h to generate a driving control signal for each of the actuators, and controls driving of the actuators of the tilt correction unit according to the driving control signal,
wherein the control unit calculates X and Y directional displacement values w according to the vertical displacement value through the following Equation (ii), extracts an X-axis component $\Delta x$ and a Y-axis component $\Delta y$ of the displacement value from the X and Y directional displacement values w, calculates corrected position (Xc, Yc) of the XY-axis stage through the following Equation (iii) to generate a chuck driving signal of the chuck transporting unit, and controls movement of the XY-axis stage of the chuck transporting unit according to the chuck driving signal, $$h=\{ovr/(W\max/W\min)\}\times T_{\!f}\qquad\text{Equation (i)}$$

wherein h is the vertical displacement value, ovr is the overdriving amount, Wmax is the maximum eccentric load (maximum pressure value), Wmin is the minimum eccentric load (minimum pressure value), and $T_{\!f}$ is a tilt correcting offset $$w=r-\sqrt{r^2-h^2}\qquad\text{Equation (ii)}$$

wherein w is the displacement value, r is a distance from a center of a rotation axis to an end point of the chuck surface, and h is the vertical displacement value, and $$Xc=x-\Delta x,$$

$$Yc=y-\Delta y\qquad\text{Equation (iii)}$$

wherein x is a current position value of the X-axis stage, y is a current position value of the Y-axis stage, $\Delta x$ is the X-axis component ($=w\cos\theta$) of w, and $\Delta y$ is the Y-axis component ($=w\sin\theta$) of w.

6. The wafer probe station according to claim 1, wherein the microcomputer of the tilt correction unit receives the driving control signal for each of the actuators as an input from the control unit, drives each of the actuators according to the driving control signal, and performs feedback control of the driving of each of the actuators by using displacement information input from each of the displacement sensors.

7. The wafer probe station according to claim 3,
wherein the wafer probe station sets and stores X and Y directional position errors $\Delta P$ occurring due to mechanical characteristics of the actuator in advance, and
wherein the control unit controls the movement of the XY-axis stage of the chuck transporting unit so as to correct the X and Y directional position errors due to the actuator.

8. A controlling method in a wafer probe station including a chuck where a wafer is mounted, a chuck transporting unit which supports and transports the chuck, a tilt correction unit which adjusts a tilt of the chuck by a plurality of actuators which are disposed under portions for supporting the chuck in a vertical direction, a probe card which is installed to be aligned for inspecting the wafer, a plurality of the pressure sensors which are disposed under the portions for supporting the chuck in the vertical direction, and a control unit which controls the chuck transporting unit so that the chuck where the wafer is mounted performs overdriving, comprising steps of:

(a) lifting up a Z-axis stage by a predetermined overdriving amount and, after that, detecting positional pressure values from the pressure sensors;

(b) calculating a vertical displacement value h by using a maximum pressure value and a minimum pressure value among the positional pressure values in the case where it is determined based on the positional pressure values that an eccentric load occurs in the chuck;

(c) calculating driving amounts of the actuators of the tilt correction unit by using the vertical displacement value so that a uniform load is applied to the chuck;

(d) calculating X and Y directional displacement values w occurring in the X and Y directions of the chuck according to the vertical displacement value; and (e) lifting down the Z-axis stage, correcting the eccentric load of the chuck by controlling the driving of the actuators according to the driving amounts, and controlling movement of an XY-axis stage by using the X and Y directional displacement values w.

9. A controlling method in a wafer probe station according to claim 8, wherein in the step (b), the vertical displacement value h is calculated by the following Equation (i), $$h=\{ovr/(W\max/W\min)\}\times T_{\!f}\qquad\text{Equation (i)}$$

wherein h is the vertical displacement value, ovr is the overdriving amount, Wmax is the maximum eccentric load (maximum pressure value), Wmin is the minimum eccentric load (minimum pressure value), and $T_{\!f}$ is a tilt correcting offset.

10. A controlling method in a wafer probe station according to claim 8,
wherein in the step (b), the vertical displacement value h is calculated by the following Equation (i),
wherein in the step (d), the X and Y directional displacement values w are calculated by the following Equation (ii), an X-axis component $\Delta x$ and a Y-axis component $\Delta y$ of the displacement value are extracted from the X and Y directional displacement values w, corrected position (Xc, Yc) of the XY-axis stage are generated by using the following Equation (iii), and the movement of the XY-axis stage is controlled based on the corrected positions, $$h = \{ovr/(W\max/W\min)\} \times T_{\!f}\qquad \text{Equation (i)}$$

wherein h is the vertical displacement value, ovr is the overdriving amount, Wmax is the maximum eccentric load (maximum pressure value), Wmin is the minimum eccentric load (minimum pressure value), and $T_{\!f}$ is a tilt correcting offset, $$w = r - \sqrt{r^2 - h^2}\qquad \text{Equation (ii)}$$

wherein, w is the displacement value, r is a distance from a center of a rotation axis to an end point of the chuck surface, and h: the vertical displacement value, and $$Xc = x - \Delta x,$$

$$Yc = y - \Delta y\qquad \text{Equation (iii)}$$

wherein x is a current position value of the X-axis stage, y is a current position value of the Y-axis stage, $\Delta x$ is the X-axis component (=w cos θ) of w, and $\Delta y$ is the Y-axis component (=w sin θ) of w.

11. The wafer probe station according to claim 2, wherein in a case where a maximum pressure value among the pressure values deviates from a predetermined effective range, the control unit sets the overdriving amount again and performs overdriving according to the newly-set overdriving amount.

12. The wafer probe station according to claim 3, wherein in a case where a maximum pressure value among the pressure values deviates from a predetermined effective range, the control unit sets the overdriving amount again and performs overdriving according to the newly-set overdriving amount.

13. The wafer probe station according to claim 2, wherein the microcomputer of the tilt correction unit receives the driving control signal for each of the actuators as an input from the control unit, drives each of the actuators according to the driving control signal, and performs feedback control of the driving of each of the actuators by using displacement information input from each of the displacement sensors.

14. The wafer probe station according to claim 3, wherein the microcomputer of the tilt correction unit receives the driving control signal for each of the actuators as an input from the control unit, drives each of the actuators according to the driving control signal, and performs feedback control of the driving of each of the actuators by using displacement information input from each of the displacement sensors.

* * * * *